(12) United States Patent
Bock et al.

(10) Patent No.: US 7,009,290 B2
(45) Date of Patent: Mar. 7, 2006

(54) HEAT SINK FOR SEMICONDUCTOR COMPONENTS OR SIMILAR DEVICES, METHOD FOR PRODUCING THE SAME AND TOOL FOR CARRYING OUT SAID METHOD

(75) Inventors: Uwe Bock, Singen (DE); Werner Graf, Engen (DE); Stephan Bock, Singen (DE)

(73) Assignee: Alcan Technology & Management Ltd., Neuhausen am Rheinfall (CH)

( * ) Notice: Subject to any disclaimer, the term of this patent is extended or adjusted under 35 U.S.C. 154(b) by 82 days.

(21) Appl. No.: 10/487,182

(22) PCT Filed: Dec. 5, 2002

(86) PCT No.: PCT/EP02/13764

§ 371 (c)(1),
(2), (4) Date: Sep. 2, 2004

(87) PCT Pub. No.: WO03/061000

PCT Pub. Date: Jul. 24, 2003

(65) Prior Publication Data

US 2005/0012202 A1    Jan. 20, 2005

(30) Foreign Application Priority Data

Jan. 2, 2002    (DE) .............................. 102 00 019

(51) Int. Cl.
*H01L 23/34* (2006.01)
*H01L 23/26* (2006.01)
*F28F 7/00* (2006.01)
*H05K 7/20* (2006.01)

(52) U.S. Cl. .................... 257/712; 257/706; 257/718; 257/722; 165/80.3; 165/185; 174/16.3; 361/697; 361/703

(58) Field of Classification Search ............... 257/712, 257/706, 718, 722; 361/679, 703; 165/80.3, 165/185; 174/16.3
See application file for complete search history.

(56) References Cited

U.S. PATENT DOCUMENTS

| 3,163,207 | A | * | 12/1964 | Schultz ........................ 165/68 |
| 6,000,462 | A | * | 12/1999 | Gonner ...................... 165/80.3 |
| 6,505,680 | B1 | * | 1/2003 | Hegde ........................ 165/80.3 |

FOREIGN PATENT DOCUMENTS

| DE | 25 02 472 | | 9/1982 | |
| DE | 35 18 310 | | 11/1986 | |
| DE | 35 18310 A1 | * | 11/1986 | |
| DE | 199 00 970 A1 | * | 7/2000 | .......... 257/E23.103 |
| DE | 101 57 240 A1 | * | 11/2001 | |
| JP | 09321186 | | 12/1997 | |

* cited by examiner

*Primary Examiner*—Jasmine Clark
(74) *Attorney, Agent, or Firm*—Bachman & LaPointe, P.C.

(57) ABSTRACT

A heat sink for semiconductor components or similar devices, especially produced from an extruded aluminum alloy. The heat sink comprises cooling ribs which rise at a distance from a base plate and which are clamped in an insert groove made in the surface of the base plate, laterally limited by longitudinal or intermediate ribs with a coupling base that has an approximately rectangular cross-section. The coupling bases are held in their insert grooves in a form-fit and are cold-welded with the base plate at least in some sections. Cross ribs extend at a distance to one another on the surfaces of the intermediate ribs and have the form of upset heels that are linked with the coupling base in a form-fit.

17 Claims, 3 Drawing Sheets

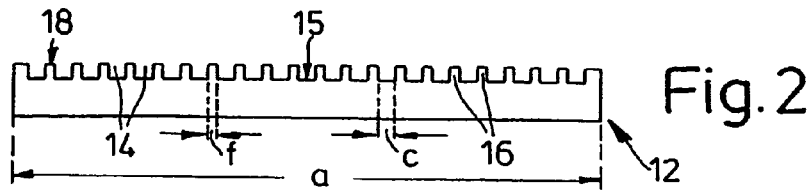
Fig. 2
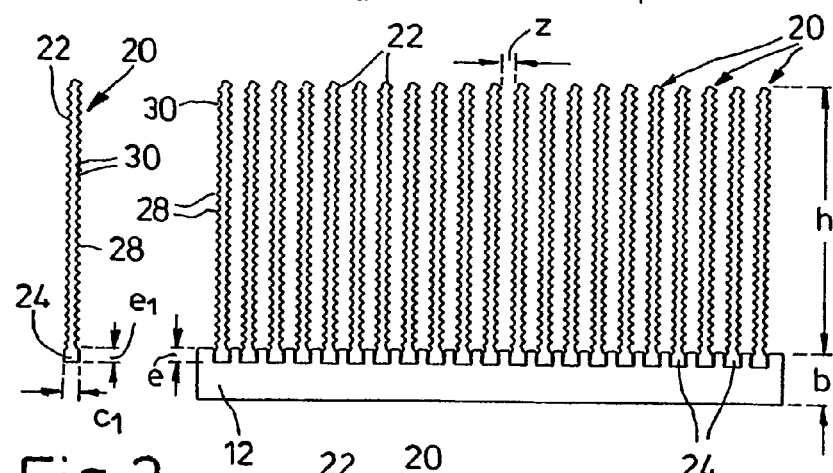
Fig. 1
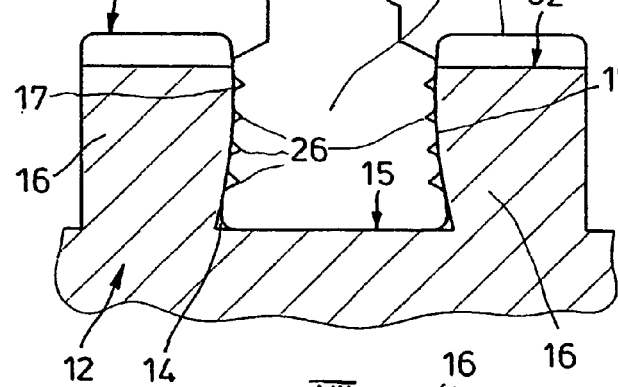
Fig. 3
Fig. 4
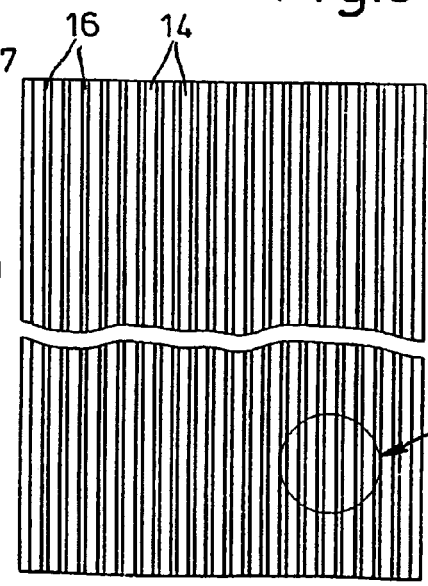
Fig. 5
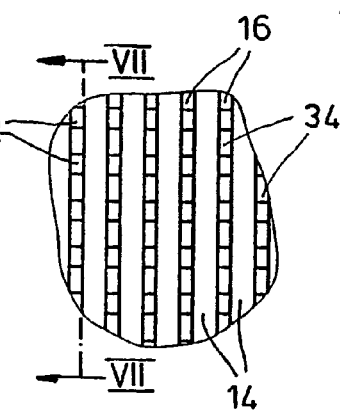
Fig. 6

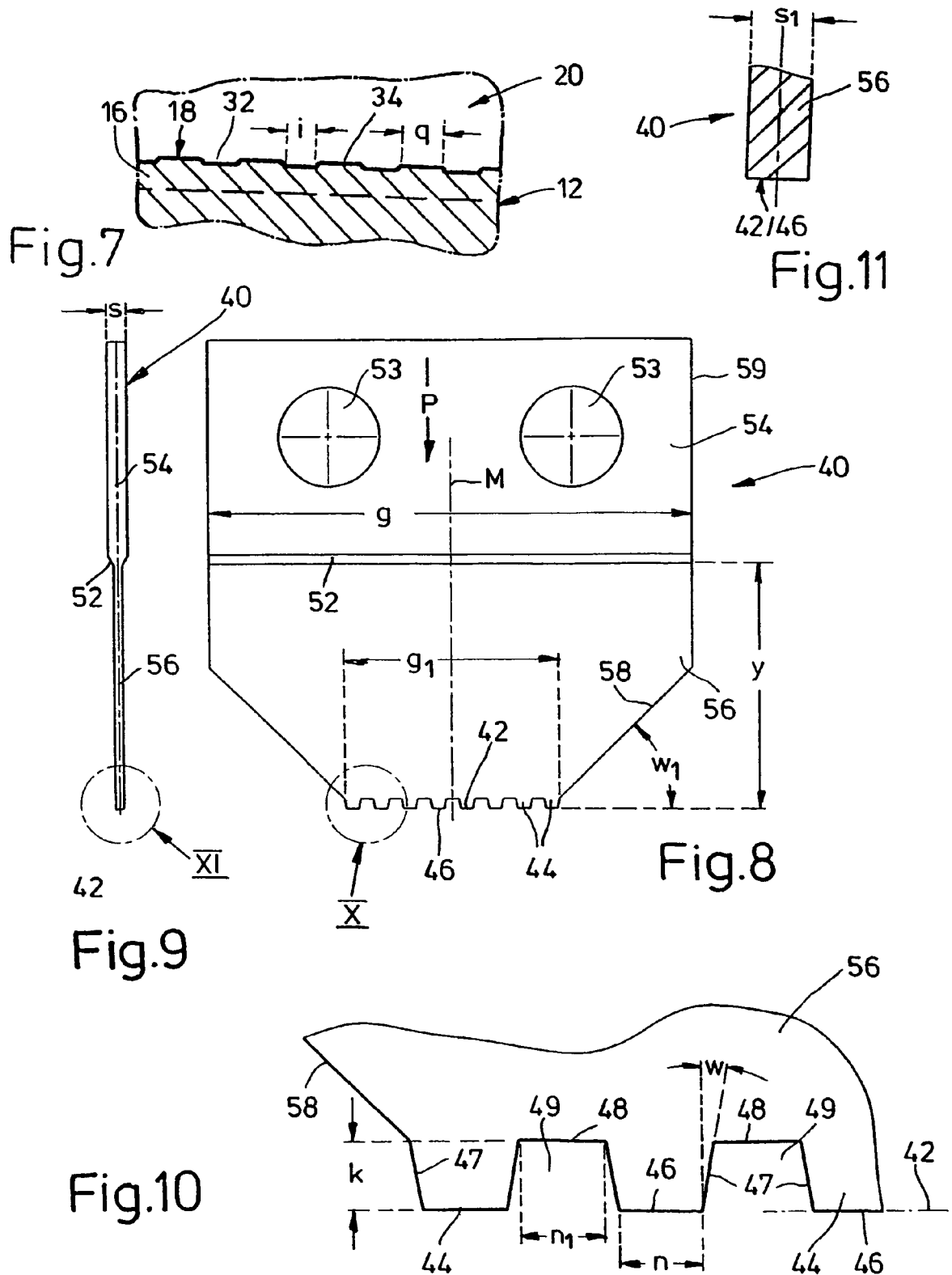

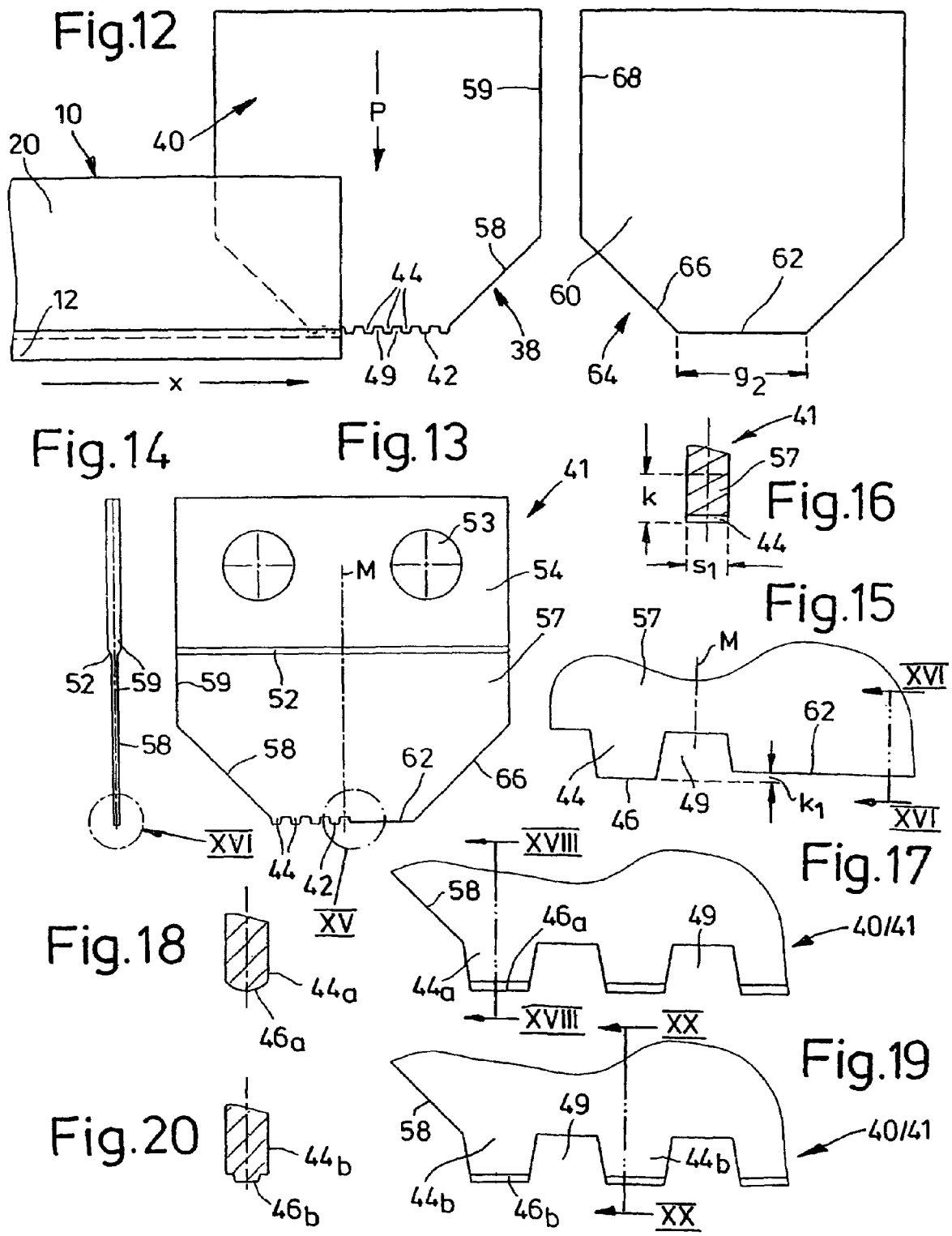

1

HEAT SINK FOR SEMICONDUCTOR COMPONENTS OR SIMILAR DEVICES, METHOD FOR PRODUCING THE SAME AND TOOL FOR CARRYING OUT SAID METHOD

BACKGROUND OF THE INVENTION

The invention relates to a heat sink for semiconductor components or similar devices, in particular made of an extruded aluminium alloy, with cooling ribs projecting from a base plate at a spacing from one another, and each being held in a clamping manner by a coupling base which is approximately rectangular in cross-section in an insertion groove which is introduced into the surface of the base plate, by means of longitudinal or intermediate ribs laterally bordering this insertion groove. The invention also relates to a method for producing a heat sink of this type and a tool for this.

Heat sinks of this type can be inferred from DE 25 02 472 A1; insertion grooves of the base housing which taper conically towards the groove base are provided for the cooling ribs on a heat sink for thyristors. These are pressed with over-dimension into the insertion grooves which are provided with longitudinal grooves in the two side walls. While in this case a minimum thickness of the rib is required in order to be able to receive the necessary pressure forces in the joining method, only an interlocking bond can be achieved in the method according to DE 35 18 310 A1.

According to the teaching of this document, extruded solid profiles with lateral recesses are inserted in an interlocking manner as cooling ribs into the insertion grooves of the separately produced base plate. The groove walls of the insertion groove, after insertion of the cooling rib, are formed by a tool which is wedge-like in design and can be retracted between two cooling ribs, the tool being inserted into an auxiliary groove with a V-shaped cross-section and partially pressing the material of the housing base into parallel grooves of the cooling rib.

In both cases the insertable number of ribs—and therefore the achievable heat-dissipating surface—is limited, on the one hand, by the required minimum thickness of the cooling ribs and, on the other hand, by the required minimum width of the intermediate grooves.

In light of the prior art, the inventors have set themselves the task of developing a new heat sink form and new manufacturing method, owing to which a higher number of ribs and therefore a larger surface can be achieved with simultaneously improved heat transfer between the heat sink base and inserted cooling ribs.

SUMMARY OF THE INVENTION

The foregoing object is achieved by the present invention. According to the invention, transverse ribs, as compression beads, extend spaced from one another on the surfaces of the intermediate ribs on the base plate of the heat sink and abut the coupling base of cooling ribs in an interlocking manner and improve the bond.

According to a further feature of the invention, the low intermediate ribs and insertion grooves have a rectangular to slightly trapezoidal cross-section.

Within the scope of the invention is a method for producing a heat sink, in which after insertion of the cooling rib, the intermediate rib of the base plate is formed by pressure on the rib surface thereof and transverse ribs, as compression beads, extending on the surface of the intermediate ribs at a spacing from one another between two cooling ribs are produced and in which a transverse pressure component and a relative movement are generated between the coupling base and the groove walls flanking it. Owing to the press pressure exerted from above, after insertion of the coupling base onto the intermediate ribs, by a comparatively wide and blunt pressing edge, the intermediate ribs are thus partially formed and said compression beads are produced on the intermediate rib and rest in an interlocking manner on the coupling base. Apart from the transverse pressure components forming during the forming process, a relative movement is achieved between the groove walls and the coupling base which by interaction leads at least partially to cold weldings. After the actual pressure process, the transverse ribs produced thereby can be again subjected to pressure and thus additionally compressed.

A tool which is designed so as to be lowerable between two cooling ribs and is equipped with a plurality of teeth which offer tooth front edges serving as pressure faces for the intermediate ribs of the base plate at the bottom edge of a plate-like insertion section, has proven particularly advantageous for this method. The length of these tooth front edges preferably corresponds to the spacing of transverse ribs on the surface of the intermediate rib. Tooth flanks which are outwardly inclined at an acute angle issue from the tooth front edge.

It has also proved favourable for the free end of the teeth to be cross-sectionally pitch circle-shaped or trapezoidal or even rectangular in design.

In a preferred configuration, the tool is produced as a spatula-like tooth plate with linear arrangement of the tooth front edges of teeth provided in a crenellated manner, wherein a side edge which is inclined at an angle is to issue from the linear section of the tooth front edges, at least at one end.

According to a different feature of the invention, the teeth are arranged on an insertion section of the tool plate, the cross-sectional width of which is less than the spacing of the cooling ribs from one another and abuts a gripping section which can preferably be connected to a whole tool. Moreover, the thickness of the gripping section is to be greater than the spacing of the cooling ribs from one another to ensure the stability in the pressure process.

In another configuration, the tool plate is to be a circular toothed disc which rotates about a shaft and in the process machines the tangentially running heat sink.

According to the invention a tool plate with a linear bottom edge can be arranged downstream in the feed direction of the moved heat sink from the tool plate containing the teeth. The process sequence described by means of pressing with a clocked feed of the profile parts to be connected can also be carried out in a rolling manner. In this instance, the base plate which is fitted with the cooling ribs, as a base profile, traversing a station with circular toothed discs and subsequent even discs.

However, it is also possible to design a tool such that the bottom edge of the tool plate partly has teeth and is partly linear in design.

BRIEF DESCRIPTION OF THE DRAWINGS

Further advantages, features and details of the invention emerge from the following description of preferred embodiments and with the aid of the drawings, in which:

FIG. 1 shows the front view of a heat sink with cooling ribs on a base plate;

FIG. 2 shows the housing base of FIG. 1;

FIG. 3 shows a cooling rib of FIG. 1;

FIG. 4 shows a section which is enlarged relative to FIG. 1 through a region of the heat sink;

FIG. 5 shows the plan view of the base plate;

FIG. 6 shows an enlarged detail from FIG. 5;

FIG. 7 shows the enlarged longitudinal section through FIG. 6 along its line VII—VII;

FIG. 8 shows a side view of a pressure tool for producing the heat sink;

FIG. 9 shows a partially sectional front view of the pressure tool;

FIGS. 10, 11 shows a respective enlarged detail from FIG. 8 or 9 along the arrows thereof X or XI;

FIG. 12 shows a partial side view of a heat sink with a positioned pressure tool and additional tool arranged downstream;

FIG. 13 shows a side view of a different pressure tool;

FIG. 14 shows a front view of FIG. 13;

FIG. 15 shows an enlarged detail from FIG. 13 according to its arrow XV;

FIG. 16 shows the section through FIG. 15 along its line XVI—XVI;

FIGS. 17, 19 each show a detail corresponding to FIG. 10 with respect to other configurations of the pressure tool;

FIGS. 18, 20 each show a part section through FIG. 17 or 19 according to the line thereof XVIII—XVIII or XX—XX.

DETAILED DESCRIPTION

A heat sink 10 for semiconductor components has a housing which is not shown in further detail in the drawings for reasons of clarity, with a base plate as a housing base 12 with here an exemplary width a of about 120 mm and a thickness b of about 10 mm.

Insertion grooves 14 extending parallel to one another and with an approximately rectangular cross-section with a width c of about 4 mm and a depth e of about 3 mm are formed into the base plate 12, the insertion grooves being separated from one another by longitudinal or intermediate ribs 16 which are also of rectangular cross-section with a width f which is somewhat smaller relative to the base grooves 14. Cooling ribs 20 which extend parallel to one another at a clear spacing z from one another are firmly located in these insertion grooves 14. The housing base or base plate 12 and cooling ribs 20 are produced separately from one another during extrusion from metal, in particular from aluminium alloys, and subsequently joined.

The cooling rib 20 consists of a plate-like rib body 22, projecting freely in the insertion position, with here a height h of about 60 mm, and a coupling base 24, of which the cross-section corresponds approximately to that of the insertion grooves 14; in FIG. 3 the base width is designated $c_1$ and the base height $e_1$. Longitudinal grooves 30, separated by ribs 28, are formed into the two free end faces of the rib body 22 of each cooling rib 20 such that the ribs 28 of the one side face oppose the longitudinal grooves 30 of the other side face (FIG. 4).

The coupling base 24 is inserted into the insertion groove 14 of the base plate 12 until it is located on the deepest part 15 of the groove. For better positional securing between the groove walls 17 of adjacent intermediate ribs 16, as shown in FIG. 4, each flank face of the coupling base 24 is provided with longitudinal mouldings 26 cross-sectionally producing a saw-like arrangement.

After insertion of the coupling base 24 into the insertion groove 14, a plate-like tool 40, loaded with pressure in the arrow direction P of FIG. 8, is placed on the surface 18 of the intermediate rib 16, the bottom edge 42 of the tool 40 which is facing that surface 18 being equipped with a crenellation-like row of teeth 44. The width i of transverse grooves or troughs 32 in the surface 18 of the machined longitudinal rib 16 moreover corresponds to the length n of the tooth front edges 46 which determine that bottom edge 42; these transverse troughs 32 are produced during the exertion of the press pressure P as impressions of those teeth 44. Tooth flanks 47 issue from their tooth front edges 46, at an angle w of about 10° to the centre line M of the tool plate 40, the tooth flanks 47 ending at inner contours 48 parallel to the tooth front edges 46 at a spacing k, with a length $n_1$ of the edge mouldings or tooth gaps 49 between the teeth 44.

FIG. 7 illustrates the profile of an intermediate rib 16 processed by the tool plate 40, with transverse troughs 32 extending at spacings q from one another, with a width i between which transverse ribs extend as compression beads 34, the surface of which is formed by a section of the rib surface 18.

The spatula-like tool plate 40 of FIGS. 8, 12 consists of a steel plate with the width g which is divided into an upper gripping section 54, having connection holes 53 for holding screws, not shown, and with the thickness s and a lower insertion section 54 with a lesser thickness $s_1$. The above-mentioned centre line M of the tool plate 40 crosses the tapering region 52 between these portions 54, 56, the tool plate 40 simultaneously being the straight line of symmetry; as the length $g_1$ of the mentioned bottom edge 42 corresponds to about half of the upper width g of the steel plates, side edges 58 inclined to the bottom edge 42 at an angle $w_1$ of 45° issue from the two ends of the bottom edge 42, the side edges 58 abutting the upper side edges 59 of the tool plate 40 extending parallel to one another, approximately half way up the height y of the insertion section 56.

During manufacture of the heat sink 10 it is guided according to FIG. 12 in the feed direction to a pressure tool 38 containing the tool plates 40 located parallel to one another, the tool plates 40 reaching between the cooling ribs 20 of the heat sink 10; the bottom edges 42 of the tool plates 40 are placed on the surfaces 18 of the longitudinal ribs 16 of the housing base or the base plate 12 and form the longitudinal ribs 16 under press pressure P in the above-mentioned manner.

The less formed zones of the mentioned transverse ribs 34 produced in the region of the tooth gaps 49 are post-formed in this example with the smooth bottom edge 62 of a pressure plate 60 of a downstream additional tool 64 such that an interlocking fit is produced between the groove walls 17 and the associated flank faces of the coupling base 24.

The contour of the pressure plate 60 of the additional tool 64 corresponds to the tool plate 40, as FIG. 12 shows; inclined side edges 66 also issue on the tool plate 40 from the bottom edge 62 with the length $g_2$, the side edges 66 passing into parallel side edges 68.

The region of the insertion section 57 located to the left of the centre line M in the tool plate 41 of FIG. 13 corresponds in design to the insertion section 56 of the tool plate 40 (FIG. 8), the centre line M extends into the last tooth gap 49 of this toothing towards the centre. The right-hand region of this insertion section 57 is equipped with a smooth bottom edge 62 like the pressure plate 60 of the additional tool 64. This bottom edge 62 is located at a spacing $k_1$ from the tooth front edges 46. The tool plates 40, 60 which are previously described with respect to FIG. 12 are integrated here in a plate 41.

The examples of FIGS. 17, 18 and 19, 20 show that the teeth 44$_a$, 44$_b$ of the tool plate 40, 41, which are also to be designated a joining chisel, can be equipped with a cross-sectionally pitch circle-shaped end face 46$_a$ or a trapezoidal end face 46$_b$—a possible triangular design is not shown.

The invention claimed is:

1. A heat sink, comprising:
   a base plate having a surface;
   at least two spaced apart intermediate ribs on the surface, wherein the spaced apart intermediate ribs extend substantially parallel to each other in a longitudinal direction and define therebetween an insertion groove;
   at least one cooling rib having a coupling base which engages in the insertion groove, wherein the coupling base is held in an interlocking manner in the insertion groove; and
   a plurality of spaced apart transverse ribs on the intermediate ribs, wherein the transverse ribs extend substantially perpendicular to the insertion groove and abut the coupling base of the at least one cooling rib.

2. A heat sink according to claim 1, including a plurality of spaced apart intermediate ribs defining a plurality of insertion grooves for securing the coupling base of a plurality of cooling ribs.

3. A heat sink according to claim 1, wherein one of the coupling base and the insertion groove has a substantially rectangular cross-section.

4. A heat sink according to claim 1, wherein one of the coupling base and the insertion groove has a substantially trapezoidal cross-section.

5. A method of producing a heat sink comprising:
   providing a base plate having a surface, at least two spaced apart intermediate ribs on the surface, wherein the spaced apart intermediate ribs extend substantially parallel to each other in a longitudinal direction and define therebetween an insertion groove;
   inserting into the insertion groove at least one cooling rib having a coupling base which engages in the insertion groove, wherein the coupling base is held in an interlocking manner in the insertion groove; and
   thereafter forming by pressure on a top surface of the intermediate ribs a plurality of spaced apart transverse ribs on the intermediate ribs, wherein the transverse ribs extend substantially perpendicular to the insertion groove and abut the coupling base of the at least one cooling rib.

6. A method according to claim 5, including providing a plurality of spaced apart intermediate ribs defining a plurality of insertion grooves for securing the coupling base of a plurality of cooling ribs.

7. A method according to claim 6, including providing a tool for forming the transverse ribs, the tool comprises a plate insertion section which is insertable between two adjoining cooling ribs, the plate insertion section includes a bottom edge having a plurality of teeth with tooth front edges serving as pressure faces for the intermediate ribs of the base plate.

8. A method according to claim 7, wherein the length (n) of the tooth front edge corresponds to the spacing of transverse ribs on the surface of an intermediate rib.

9. A method according to claim 8, wherein the teeth have tooth flanks which are outwardly inclined from the tooth front edge at an acute angle ($w_1$).

10. A method according to claim 7, wherein the free end of the teeth is one of cross-sectionally pitch circle-shaped, trapezoidal, and triangular in design.

11. A method according to claim 7, wherein a spatula-like tool plate with a linear arrangement of the tooth front edges of teeth are provided in a crenellated manner.

12. A method according to claim 11, wherein a side edge which are inclined at an angle ($w_1$) issues from the linear section of the tooth front edges, at least at one end.

13. A method according to claim 12, wherein the teeth are arranged on one insertion section of the tool plate, of which the cross-sectional width ($s_1$) is less than the spacing (z) of the cooling ribs from one another, and is abutted by a gripping section.

14. A method according to claim 13, wherein the thickness (s) of the gripping section is greater than the spacing (z) of the cooling ribs from one another.

15. A method according to claim 7, wherein the tool as a circular toothed disc.

16. A method according to claim 7, arranging a further tool plate with a linear bottom edge downstream in a feed-direction (x) of the heat sink after the tool plate containing the teeth.

17. A method according to claim 7, wherein the bottom edge of the tool plate partially has teeth and is partially designed in a linear manner.

* * * * *